United States Patent [19]  [11] 4,165,538
Kitamura  [45] Aug. 21, 1979

[54] READ-ONLY MEMORY

[75] Inventor: Yoshishige Kitamura, Tokyo, Japan

[73] Assignee: Nippon Electric Co., Ltd., Tokyo, Japan

[21] Appl. No.: 889,525

[22] Filed: Mar. 23, 1978

[30] Foreign Application Priority Data

Mar. 23, 1977 [JP] Japan .................................. 52/32559

[51] Int. Cl.$^2$ ....................... G11C 17/00; G11C 17/06
[52] U.S. Cl. ..................................... 365/104; 365/185
[58] Field of Search ............... 365/104, 103, 105, 184, 365/185; 340/166 R

[56] References Cited
PUBLICATIONS

Krick, Complementary MNOS Electrically Alterable Read-Only Memory, IBM Tech. Disc. Bul., vol. 13, No. 1, 6/70, pp. 263-264.
Jordan et al., Read-Only Memory, IBM Technical Disc. Bul., vol. 14, No. 7, 12/71, pp. 2132-2135.
Askin, Single Device Push-Pull Read-Only Storage Cell, IBM Technical Disclosure Bulletin, 10/73, vol. 16, No. 5, p. 1642.

Primary Examiner—Stuart N. Hecker
Attorney, Agent, or Firm—Hopgood, Calimafde, Kalil, Blaustein & Lieberman

[57] ABSTRACT

A read-only memory wherein a memory cell is included at each cross point between word lines and bit lines. The memory cell includes a pair of programmable non-volatile gating elements, rendered conductive and non-conductive respectively, to permit a second gating element to connect first and second potential sources to said bit lines.

6 Claims, 8 Drawing Figures

READ-ONLY MEMORY

FIELD OF THE INVENTION

The present invention relates to a read-only memory (hereinafter abbreviated as ROM), and more particularly, to a ROM device realized in the form of a semiconductor integrated circuit.

BACKGROUND OF THE INVENTION

ROM devices, constructed by arranging semiconductor circuit elements in a matrix form, have been widely used as integrated circuits. Prior art ROM devices comprise a plurality of word lines and a plurality of bit lines which are arranged in rows and columns to form a matrix, with gate elements included at selected cross-points of the matrix. Each gate element has first and second electrodes and a control electrode, the control electrode being connected to an associated word line, and the first and second electrodes being connected to an associated bit line and a first potential source, respectively. The bit lines are connected via respective load elements to a second potential source.

In such a ROM device, a write-on operation is performed by selectively arranging the elements at the cross-points. More particularly when a word line is energized at a predetermined selection level, the resistance between the associated bit line and the potential source becomes low at the cross-point provided with the gate element but the resistance remains high at the cross-point without the gate element. While the word line is at a non-selection level, either cross-point remains at an insulating state, so that by selectively activating a word line, read-out outputs can be obtained from the junction points between the associated bit lines and the load elements. Such a ROM device is disclosed, for example, in "MOS/LSI Design and Application" published by McGraw-Hill Book Co., authored by William N. Carr and Jack P. Mize, 1972, pp. 197-198, in which MOS transistors are used as gate elements and load elements.

In prior art ROM devices, the potential of the bit line can be quickly varied via the gate element having a low resistance. The bit line potential will approximate the potential of the first potential source when the gate element is conducting. However, when this gate element assumes a non-selection state, the potential of the bit line is charged to the potential of the second potential source via the load element having a relatively high resistance. Due to the high-resistance load element a long time is required for the charging process. The result is that preparation time is required between a read-out operation and a subsequent read-out operation with the required preparation time being equal to the aforementioned time necessitated for the charging process. Accordingly, the operation speed of the ROM is adversely decreased. In addition, in such a ROM, the memory element and the load element serve as a D.C. current path established between the first and second potential sources during read-out operations. Due to the existence of this current path the ROM has the disadvantage of large power consumption.

It is therefore an object of the present invention to provide a ROM device that can operate at high speeds.

It is a further object of the present invention to provide a ROM that has small power consumption.

SUMMARY OF THE INVENTION

A read-only memory according to the present invention is characterized in that at each cross-point, between word lines and bit lines, there is disposed a gate or switching element having first, second and control electrodes.

It is a feature of the invention that the first electrode of the selected gate element is coupled to a potential corresponding to either one of logic "1" and logic "0" while that of the nonselected gate element is coupled to another potential corresponding to the other of logic "1" and logic "0". It is another feature of the invention that the second electrode is connected. The second electrode is connected to the relevant bit line, and the potential applied to the first electrode is also applied to the relevant bit line via the second electrode by controlling the control electrode through the word line to drive the gate element.

These and other objects and features of the invention will be more fully appreciated from the following detailed description when taken in conjunction with the accompanying drawings.

DETAILED DESCRIPTION

Figure 1:
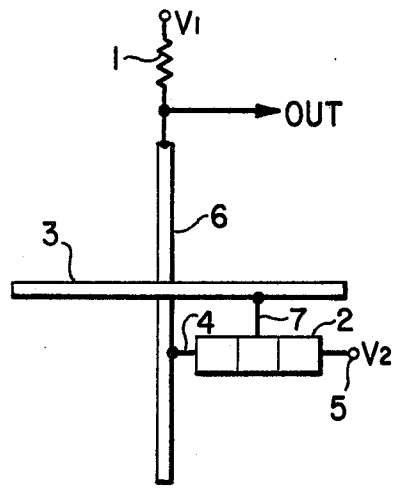
FIG. 1 is a schematic view showing the structure of one bit section in a prior art ROM.

Refer to FIG. 1 for a description of the bit section in the circuit of a prior art. A load element 1 normally has a resistance approximately 10 times as high as the resistance of a fixed gate element 2 when it presents a low resistance under a selected state. When word line 3 has been selected, and if a low resistance is present between the first and second electrodes 4 and 5 of fixed gate element 2, the potential on bit line 6 is fixed in proportion to the resistances of the load element 1 and the gate element 2 and this potential will take a value near to the potential $V_2$ of a first potential source. Alternatively if an insulating state is present between the first and second electrodes 4 and 5, under the selected state, the potential on bit line 6 will take a value near to a potential $V_1$ of a second potential source via the load element 1. As a result, stored information can be read-out as the potential on bit line 6. In this instance, the read-out time required is at least equal to the time for charging the bit line 6 through the resistance between the first and second electrodes of the fixed gate element 2. However, since the resistance of the load element 1 is a high value in comparison to the resistance between the electrodes of the fixed gate element, when conducting as described above, a disadvantage results. That disadvantage is that, after the readout operation has been completed, the charging time required for the potential on bit line 6 to be charged to potential $V_1$, of the second potential source, via the load element 1 will be several times as long as the switching time required when the fixed gate element is conducting and at a low resistance. Furthermore, upon readout, if the selected fixed memory element 2 presents a low resistance, a current path is established between the second potential source $V_1$ and the first potential source $V_2$, so that the ROM has the disadvantage of high power consumption.

Figure 2:
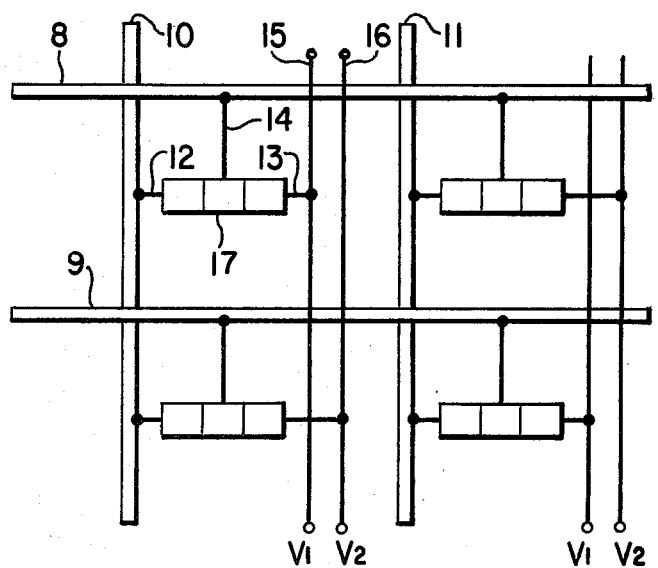
FIG. 2 is a schematic view showing a basic ROM structure according to the present invention.

A basic ROM structure according to the present invention will be described, by way of example, in connection with a read-only memory having a memory capacity of 4 bits with reference to FIG. 2. A crosspoints between word lines 8 and 9 and bit lines 10 and 11 there are provided four memory bit positions. Four gate elements 17, each having first electrode 12, second electrode 13 and a control electrode 14 are disposed at the four memory bit positions respectively. The first electrodes 12 of the gate elements 17 are connected to the relevant bit lines 10 or 11 respectively. The control electrodes 14 are connected to the relevant word lines 8 or 9 respectively. The second electrodes 13 of the gate elements 17 are respectively connected to either a first potential source 15, corresponding to logic "1", or a second potential source 16, corresponding to logic "0", depending upon the fixed memory information to be stored at the respective bit positions. Upon operation of this ROM circuit, in response to selection of one of the word lines, a low resistance is presented between the first and second electrodes of the relevant gate element 17 having the control electrode connected to the selected word line. In this manner information can be read-out by the potential changes on the relevant bit line to either the potential $V_1$ or $V_2$ applied to the second electrodes from the potential sources 15 or 16, respectively. At this time an insulating state is maintained between the first and second electrodes of the gate element 17 having the control electrode connected to the other word line, i.e., the nonselected word line.

In the above-described ROM, according to the present invention, since the bit line is always quickly charged up to the potential corresponding to a logic "1" or logic "0" through the gate element having the low resistance, the time required for readout operation can be significantly decreased. Furthermore, as the gate element merely transmits the potential corresponding to the given logic level to the bit line and no D.C. current path exists between the potential sources, the ROM according to the present invention has the advantage of small power consumption.

Figure 3A:
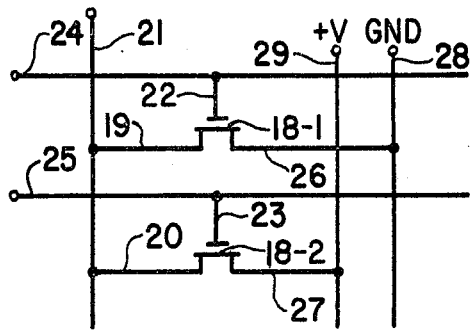
FIGS. 3(a) to 3(c) are circuit diagrams showing first to third preferred embodiments of the present invention, respectively.

A first preferred embodiment of the present invention, as applied to a ROM having a memory capacity of 2 bits, will now be described with reference to FIG. 3(a). One N-channel insulated gate field effect transistors (hereinafter referred to as MOS FET), such as FET's 18-1 and 18-2, are employed for each bit position. Drain electrodes 19 and 20 are connected to a bit line 21. Gate electrodes 22 and 23 are connected to word lines 24 and 25, respectively. Source electrodes 26 and 28 are connected in potential sources 28 and 29, respectively, which are held at a ground potential GND and at a positive potential +V depending upon the information to be stored. When one of the word lines 24 and 25 is selected, to place the MOS FET connected to the selected word line in a conducting state, the potential on the bit line assumes either a ground potential or a positive potential depending upon the potential at the source electrode, and a read-out operation is thereby performed. For example, if word line 24 is selected, to make MOS FET 18-1 conducting, the logic level defined by the ground potential GND is read-out on the bit line 21.

Figure 3B:
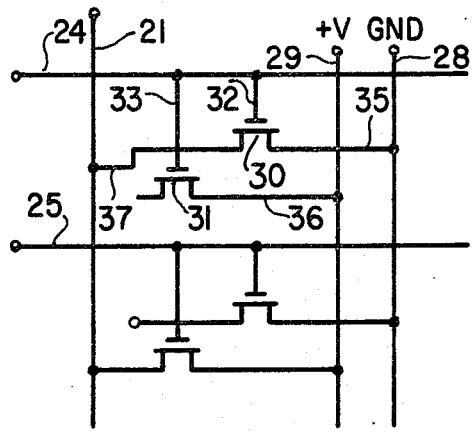

Now a second preferred embodiment of the present invention will be described with reference to FIG. 3(b). Two N-channel MOS FET's 30 and 31 are used for each one-bit of storage. Gate electrodes 32 and 33 of the MOS FET's are connected to a word line 24. Source electrodes 35 and 36 thereof are respectively connected to potential sources 28 and 29, which are held at the ground potential GND and at the positive potential +V, respectively. A drain of either the MOS FET 30, connected to ground potential, or the MOS FET 31 connected to potential source 29 of positive potential, is connected to the bit line 21 depending upon the information to be stored. In the illustrated embodiment, the drain 37 of the MOS FET 30 is connected to bit line 21, and hence the stored information is a logic "0". It is to be noted that the operation of the above-described circuit is similar to that of the first preferred embodiment.

Figure 3C:
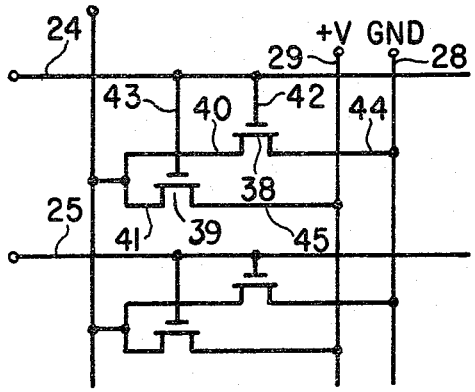

Next, a third preferred embodiment of the present invention will be described with reference to FIG. 3(c). Two N-channel MOS FET's 38 and 39 are used for each one-bit of storage. Drain electrodes 40 and 41 of the MOS FET's are connected to bit line 21. Gate electrodes 42 and 43 thereof are connected to word line 24. Source electrodes 44 and 45 are respectively connected to potential sources 28 and 29, which are held at a ground potential GND and at a positive potential +V, respectively. In this embodiment, depending upon the information to be stored in each bit position, the thickness of the gate insulating film of one MOS FET, for instance, 38 is preliminarily formed to a thickness of approximately 1000 Å, while the gate oxide film of the other MOS FET, for instance, 39 is formed to a thickness of approximately 10,000 Å. In the illustrated case, when the word line 24 is selected, the MOS FET 39 having the thick gate oxide film maintains an insulating state, whereas only the MOS FET 38 having the thin gate oxide film becomes conducting to present a logic "0" of ground potential to bit line 21. Thus, similarly to the first preferred embodiment, a read-out of a stored logic "0" can be performed.

Figure 4:
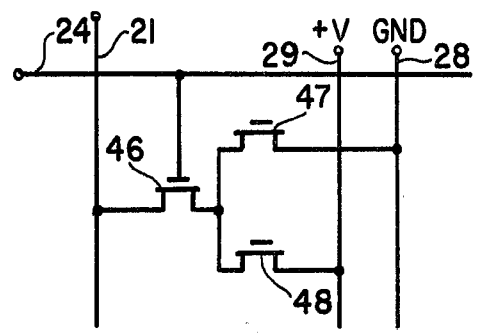
FIG. 4 is a circuit diagram showing a fourth preferred embodiment of the present invention.

A fourth preferred embodiment of the present invention will now be described with reference to FIG. 4. One N-channel MOS FET 46 and two N-channel floating gate FET's 47 and 48 are used for each one-bit of storage. The sources or drains of the FET's 47 and 48 are connected to ground potential and to the potential of the positive potential +V respectively. The drains or sources thereof are connected, in common, to the source or drain of FET 46, the drain or source of which is connected to the bit line 21. A write-in operation is performed by injecting electric charge into the gate of either one of the two floating gate MOS FET's 47 and 48 to make the FET conducting. Accordingly, the write-in operation employed in this embodiment can be electrically preformed with ease.

Read-out of the stored information is performed by selecting the word line 24, thereby activating MOS FET 46, and by reading out the potential which appears on the bit line 21 via one of the floating gate FET's 47 and 48 that is conducting. The write-in operation or rewrite-in operation is performed by selecting the word line 24 to make the MOS FET 46 conducting, and thereafter applying a high voltage between the bit line 21 and one of the potential source terminals 28 and 29 corresponding to the information in. This serves to be written to inject electric charge to the gate for making one of the floating gate FET's conductive.

In connection with the first to fourth preferred embodiments described above, P-channel MOS FET's can also be used by changing the potential of the potential sources to a negative polarity.

Figure 5:
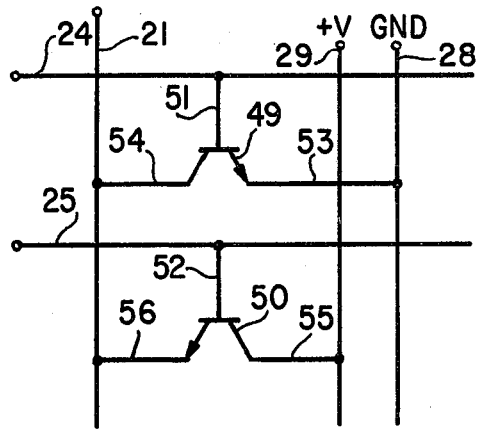
FIG. 5 is a circuit diagram showing a fifth preferred embodiment of the present invention.

A fifth preferred embodiment of the present invention will now be described with reference to FIG. 5. An NPN transistor 49 or 50 is used as a gate element for each one-bit of storage an NPN transistor 49 or 50 is used. A base electrode 51 of the transistor 49 and a base electrode 52 of the transistor 50 are connected to word lines 24 and 25, respectively. In this instance, the emitter 53 and collector 54 of the transistor 49 are connected to ground potential GND and to the bit line 21 respectively to bring the bit line 21 to ground potential for storage of a logic "0" when word line 24 is selected. The collector 55 and the emitter 56 of the transistor 50 are connected to the positive potential +V and to the bit line 21 to bring the bit line 21 to a positive potential when word line 25 is selected for storage of a logic "1". In this embodiment, it is only necessary to arrange the transistors so as to connect the two potential sources and the bit line 21 through forward biased transistors.

Figure 6:
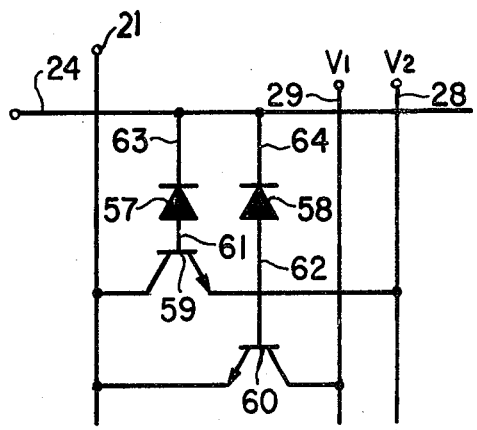
FIG. 6 is a circuit diagram showing a sixth preferred embodiment of the present invention.

Finally, a sixth preferred embodiment of the present invention will be described with reference to FIG. 6. As a gate element for each one-bit of storage, two diodes 57 and 58 and two NPN transistors 59 and 60 are used. The two NPN transistors 59 and 60 have their collector and emitter electrodes connected between the bit line 21 and two different values of potential sources $V_1$ and $V_2$ when the transistors are forward biased with respect to the two potential sources. This is similar to the case of storing two memory states in the fifth preferred embodiment described above. The base electrodes of the transistors 59 and 60 are respectively connected to anode electrodes 61 and 62 of the respective diodes 57 and 58, the cathode electrodes 63 and 64 of which are connected to the word line 24 in common. In this manner an electrically writable construction is achieved. Write-in of information to this bit of storage is performed by applying a high voltage, sufficient to destroy the junction of the diodes 57 or 58, either between the word line 24 and the bit line 21 or between the word line 24 and a lower potential source ($V_2$) 28 to thereby breakdown the junction of the diode and to make the diode conducting. If the junction of the diode 57 is destroyed, to thereby make it conducting, read-out information presented at the bit line 21 corresponds substantially to the potential of $V_2$ when the word line 24 is selected since only the transistor 59 is turned on. Also, if the junction of the diode 58 is destroyed, to thereby make it conducting, the read-out information presented at the bit line 21 corresponds substantially to the potential of $V_1$ because of the conduction in the diode 58.

In connection to the fifth and sixth preferred embodiments, PNP transistors can also be used by reversing the polarity of the potential at the potential source and the polarity of the diodes. In addition, with regard to the fifth and sixth preferred embodiments, a further practically useful circuit can be provided by incorporating a suitable bias resistance in the base circuit or the emitter circuit of the transistor to achieve stabilization of the operating point.

The foregoing disclosure and description of the invention is illustrative and explanatory thereof and various changes in the details of the illustrated construction may be made within the scope of the appended claims without departing from the spirit of the invention.

We claim:

1. A read-only memory comprising a plurality of word lines, a plurality of bit lines, a first potential source, a second potential source, and a plurality of memory cells disposed at cross-points between said word lines and said bit lines, each of said memory cells including a pair of programmable nonvolatile first gating means, into which information is written to make said pair of programmable nonvolatile first gating means conductive and nonconductive, respectively, and second gating means for operatively coupling an associated one of said bit lines with one of said first and second potential sources in response to one of said pair of programmable nonvolatile gating means being conductive, said second gating means having a control means and being operative at the time the potential level of an associated one of said word lines is at a predetermined value.

2. The memory according to claim 1, in which said second gating means includes a gate element having a first electrode coupled to an associated one of said bit lines, said control means being an control electrode coupled to an associated one of said word lines and a second electrode, said pair of programmable nonvolatile first gating means including a first floating gate field effect transistor coupled between said second electrode and said first potential source and a second floating gate field effect transistor coupled between said second electrode and said second potential source.

3. The memory according to claim 1, in which said second gating means includes a first bipolar transistor operatively coupled between an associated one of said bit lines and said first potential source wherein said control means is a base electrode and a second bipolar transistor operatively coupled between an associated one of said bit lines and said second potential source wherein said control means is a base electrode, said pair of programmable nonvolatile first gating means including a first diode coupled between an associated one of said word lines and said base electrode of said first transistor and a second diode coupled between an associated one of said word lines and said base electrode of said second transistor.

4. A read-only memory comprising a plurality of word lines, a plurality of bit lines, a first potential source, a second potential source and a plurality of memory cells disposed at cross-points between said word lines and said bit lines, each of said memory cells including a gating element having a first electrode coupled to an associated one of said bit lines, a control electrode coupled to an associated one of said word lines for controlling the conductivity of said gating element, a second electrode and a pair of programmable nonvolatile gating elements coupled between said second electrode and said first potential source and between said second electrode and said second potential source respectively, said pair of programmable nonvolatile gating elements being responsive to written-in information for making said pair of programmable nonvolatile gating elements conductive and nonconductive, respectively.

5. A read-only memory comprising a plurality of word lines, a plurality of bit lines, a first potential source, a second potential source and a plurality of memory cells disposed at cross-points between said word lines and said bit lines, each of said memory cells including a first bipolar transistor operatively coupled between an associated one of said bit lines and said first potential source, a second bipolar transistor operatively coupled between an associated one of said bit lines and said second potential source and a pair of diodes coupled between an associated one of said word lines and a base of said first bipolar transistor and between an associated one of said word lines and a base of said second bipolar transistor, respectively, said diodes being responsive to information written into said pair of diodes for short-circuiting and open-circuiting said pair of diodes, respectively.

6. The memory of claims 1, 2, 3, 4 or 5, in which the potential of said first potential source corresponds to a logic "1" level and the potential of said second potential source corresponds to a logic "0" level.

* * * * *